US012588507B2

(12) United States Patent
Park et al.

(10) Patent No.: US 12,588,507 B2
(45) Date of Patent: Mar. 24, 2026

(54) IMPINGEMENT COOLING IN HIGH POWER PACKAGE

(71) Applicant: CAES SYSTEMS LLC, Arlington, VA (US)

(72) Inventors: Chul Hong Park, Blue Bell, PA (US); David Allan Gauche, Bethlehem, PA (US); Jack Melloy, Doylestown, PA (US)

(73) Assignee: CAES SYSTEMS LLC, Arlington, VA (US)

( * ) Notice: Subject to any disclaimer, the term of this patent is extended or adjusted under 35 U.S.C. 154(b) by 333 days.

(21) Appl. No.: 17/386,264

(22) Filed: Jul. 27, 2021

(65) Prior Publication Data

US 2023/0030167 A1 Feb. 2, 2023

(51) Int. Cl.
H01L 23/473 (2006.01)
H01L 21/48 (2006.01)
H01L 23/467 (2006.01)

(52) U.S. Cl.
CPC ...... H01L 23/4735 (2013.01); H01L 21/4882 (2013.01); H01L 23/467 (2013.01)

(58) Field of Classification Search
CPC ........................ H01L 23/4336; H01L 23/4735
See application file for complete search history.

(56) References Cited

U.S. PATENT DOCUMENTS

| | | | | |
|---|---|---|---|---|
| 6,208,513 B1 * | 3/2001 | Fitch | .................... | H01L 23/3677 |
| | | | | 257/713 |
| 6,366,462 B1 * | 4/2002 | Chu | ....................... | H01L 23/427 |
| | | | | 257/714 |
| 2004/0061218 A1 * | 4/2004 | Tilton | ........................ | F28D 5/00 |
| | | | | 257/710 |
| 2004/0145868 A1 * | 7/2004 | Nair | ....................... | H01L 23/467 |
| | | | | 257/E23.099 |
| 2004/0173901 A1 * | 9/2004 | Mallik | .................. | H05K 1/0204 |
| | | | | 257/E23.101 |
| 2006/0138643 A1 * | 6/2006 | Lu | ........................ | H01L 23/3128 |
| | | | | 257/E23.092 |
| 2006/0250773 A1 * | 11/2006 | Campbell | ........... | H01L 23/4735 |
| | | | | 165/80.4 |
| 2007/0227173 A1 * | 10/2007 | Bezama | .............. | H01L 23/4735 |
| | | | | 62/304 |
| 2008/0310116 A1 * | 12/2008 | O'Connor | ............. | H01L 23/473 |
| | | | | 257/E23.098 |

(Continued)

*Primary Examiner* — Benjamin P Sandvik
(74) *Attorney, Agent, or Firm* — ALSTON & BIRD LLP

(57) ABSTRACT

This application is directed to cooling a semiconductor system. The semiconductor system includes a device substrate having a first surface and a second surface, an electronic component thermally coupled to the device substrate, and a cooling substrate coupled to the device substrate. The cooling substrate includes a third surface facing the second surface of the device substrate, a fourth surface opposite the third surface, and a plurality of vias between the third and fourth surfaces. The second surface and the third surface define a cavity therebetween, such that in use coolant flows from the fourth surface through the plurality of vias to exit at the third surface, enters the cavity between the second and third surfaces, and impinges on the second surface. At least a portion of one or more of the device substrate and the cooling substrate have similar coefficients of thermal expansion.

20 Claims, 5 Drawing Sheets

300

(56) References Cited

U.S. PATENT DOCUMENTS

| | | | |
|---|---|---|---|
| 2009/0294106 A1* | 12/2009 | Flotta | H01L 23/4735 165/104.33 |
| 2009/0314467 A1* | 12/2009 | Campbell | H01L 23/4735 165/80.4 |
| 2010/0309635 A1* | 12/2010 | Sasaki | H01L 23/3677 257/E23.083 |
| 2019/0006269 A1* | 1/2019 | Xu | H01L 21/4825 |
| 2019/0074235 A1* | 3/2019 | Zou | H01L 23/3677 |
| 2021/0098335 A1* | 4/2021 | Yu | H01L 23/3677 |

* cited by examiner

100

200

300

400

450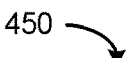

452
Provide a device substrate having a first surface and a second surface opposite the first surface

454
Form an electronic component on the first surface of the device substrate

456
Provide a cooling substrate having a third surface, a fourth surface opposite the third section, and a plurality of vias between the third and fourth surfaces > 458
> The cooling substrate is coupled to the device substrate > 460
> The third surface faces the second surface of the device substrate > 462
> The second surface and the third surfaces define a cavity there between, such that in use coolant flows from the fourth surface through the plurality of vias exit at the third surface, enters the cavity between the second and third surfaces, and impinges on the second surface of the device substrate

464
Couple a plurality of nozzle structures to the plurality of vias

466
Form predetermined patterns on the device substrate and/or the electronic component

Figure 4B

IMPINGEMENT COOLING IN HIGH POWER PACKAGE

TECHNICAL FIELD

The disclosed embodiments relate generally to semiconductor packaging technology, and in particular to, methods and systems of using impingement cooling to dissipate heat generated by electronic components in a semiconductor assembly.

BACKGROUND

High speed and high power electronic components are widely used in electronic devices. These electronic components often generate large amount of heat that must be dissipated quickly and efficiently to maintain normal device performance. Existing solutions either require a larger footprint than that occupied by the high speed components or implement expensive systems to quickly dissipate heat generated by these components. As such, there is a need for compact cooling solutions that can cool down high speed and/or high power components in an electronic system effectively and efficiently.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to reduce heat in a semiconductor system such that electronic components can operate at higher speeds and higher power. Specifically, in an example, an electronic component (e.g., a semiconductor die, a semiconductor package, etc.) is formed on a device substrate that provides cooling to the electronic component through their contact. Specifically, the device substrate absorbs heat generated by the electronic components and is cooled by a jet of coolant that is provided through a cooling substrate and impinges upon the device substrate. Some embodiments described herein include a semiconductor package that applies impingement cooling based on an improved thermal coefficient cooling model. Some embodiments relate to a semiconductor system and method for mounting the semiconductor package in a radio frequency (RF) assembly that creates a coolant path for impingement cooling while maintaining a solid RF ground.

In accordance with some embodiments, a semiconductor system includes a device substrate having a first surface and a second surface opposite the first surface, an electronic component thermally coupled to the device substrate, and a cooling substrate coupled to the device substrate. The cooling substrate includes a third surface facing the second surface of the device substrate, a fourth surface opposite the third surface, and a plurality of vias between the third and fourth surfaces. The second surface of the device substrate and the third surface of the cooling substrate define a cavity therebetween, such that in use coolant flows from the fourth surface through the plurality of vias to exit at the third surface, enters the cavity between the second surface of the device substrate and third surface of the cooling substrate, and impinges on the second surface of the device substrate.

At least a portion of one or more of the device substrate and the cooling substrate have similar coefficients of thermal expansion.

In some embodiments, the device substrate is configured to spread heat uniformly across its first and second surfaces.

In some embodiments, the device substrate includes a single crystal diamond configured to spread and dissipate heat. Alternatively, in some embodiments, the device substrate includes a polycrystalline diamond substrate configured to spread and dissipate heat.

In some embodiments, the plurality of vias are coupled to a plurality of nozzle structures, and the cooling substrate and the plurality of nozzle structures have thermal expansion coefficients similar to one another.

In some embodiments, the cooling substrate is coupled to the device substrate via one or more spacers. Further, in some embodiments, the one or more spacers are integral parts of the cooling substrate.

In some embodiments, the cooling substrate is made of one of glass, a nickel-cobalt ferrous alloy, a 36% nickel steel alloy, and Molybdenum.

In some embodiments, the cooling substrate is made of one of a metallic material having a thermal expansion coefficient in a range including a predefined thermal expansion coefficient of $1 \times 10^{-6}$ m/(m·° C.). Further, in some embodiments, the range is $0-8 \times 10^{-6}$ m/(m·° C.), and the thermal expansion coefficient of the metallic material is in the range. Additionally, in some embodiments, the range is $1-7 \times 10^{-6}$ m/(m·° C.), and the thermal expansion coefficient of the metallic material is in the range. Also, in some embodiments, the range is $1-3 \times 10^{-6}$ m/(m·° C.), and the thermal expansion coefficient of the metallic material is in the range.

In some embodiments, the cavity is fully sealed except the plurality of vias that allow the coolant to flow between the third and fourth surfaces. The coolant is configured to enter and exit the cavity via the plurality of vias.

In some embodiments, the electronic component is configured to operate in a radio frequency range, and the device substrate is made of silicon carbide. Further, in some embodiments, the silicon carbide has a thermal expansion coefficient approximately equal to $3-4 \times 10^{-6}$ m/(m·° C.).

In some embodiments, the plurality of vias have a diameter between 50 to 200 micrometers inclusive.

In some embodiments, each surface has a surface length of approximately 10 millimeters (mm) by 6 mm.

In some embodiments, the cavity separates the second surface and the third surface by at least 100 micrometers. Further, in some embodiments, the cavity separates the second surface by no more than 3 mm.

In some embodiments, the device substrate includes a plurality of patterns configured to remove heat and/or cool the device substrate.

In some embodiments, the electronic component includes a plurality of patterns configured to remove heat and/or cool the electronic component. Further, in some embodiments, the predetermined patterns include one or more fins, pins, depressions, channel, and ridges. Additionally, in some embodiments, the predetermined patterns are symmetrical. Conversely, in some embodiments, the predetermined patterns are asymmetrical.

In another aspect, a method for fabricating a semiconductor system includes providing a device substrate having a first surface and a second surface opposite the first surface. The method further includes forming an electronic component on the first surface of the device substrate and providing a cooling substrate having a third surface, a fourth surface opposite the third surface, and a plurality of vias between the third and fourth surfaces. The cooling substrate is coupled to the device substrate, the third surface faces the second surface of the device substrate, and the second surface and the third surfaces define a cavity therebetween. In use, coolant flows from the fourth surface through the plurality of vias exit at the third surface, enters the cavity between the second and third surfaces, and impinges on the second surface of the device substrate. In some embodiments, the method further includes coupling a plurality of nozzle structures to the plurality of vias. In some embodiments, the method further includes forming predetermined patterns on the device substrate and/or the electronic component. Further, in some embodiments, the predetermined patterns include one or more fins, pins, depressions, channel, and ridges.

The fabricated semiconductor of any embodiments of the above methods is any of the fore-mentioned semiconductor systems.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIGS. 4A and 4B illustrate a process of fabricating a semiconductor system, in accordance with some embodiments.

Figure 1:
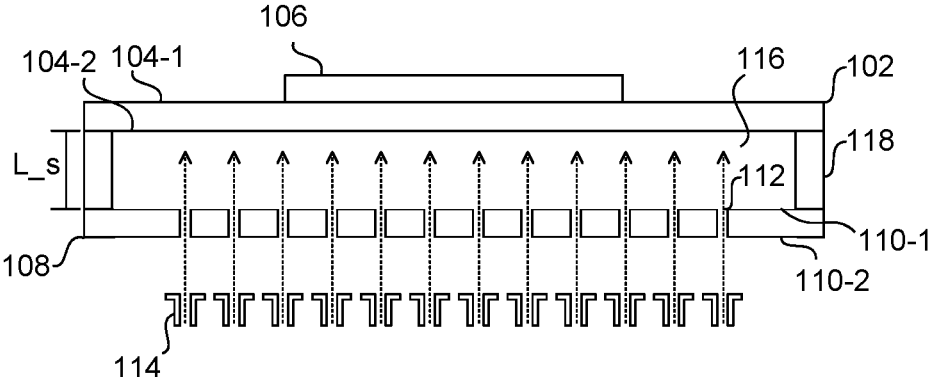
FIG. 1 is a cross sectional view of a semiconductor system having a cavity for impingement cooling, in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

FIG. 1 is a cross sectional view of a semiconductor system 100 having a cavity for impingement cooling, in accordance with some embodiments. The semiconductor system 100 includes one or more of a device substrate 102, an electronic component 106, a cooling substrate 108, a plurality of vias 112, one or more nozzles 114, a cavity 116, and one or more spacers 118. The device substrate 102 includes a first surface 104-1 and a second surface 104-2, and the second surface 104-2 is opposite the first surface 104-1. In some embodiments, the first surface 104-1 and the second surface 104-2 have a surface area of approximately 10×6 mm². In some embodiments, each of the first and second surfaces 104-1 and 104-2 is flat.

In some embodiments, each of the first and second surfaces 104-1 and 104-2 has a predetermined pattern (also called surface profile) including one or more heat transfer structures known in the art. For example, the predetermined pattern of the device substrate 102 includes one or more fins, pins, depressions, channels, and/or ridges. Each heat transfer structure in the predetermined pattern of the device substrate 102 can have different sizes and/or geometric shapes. For example, the fins formed in the pattern of the device substrate 102 optionally include circular or square pillars having different surface areas. The one or more heat transfer structures can be arranged in a symmetric or asymmetric manner in the predetermined pattern of the device substrate 102. By these means, the predetermined pattern increases a surface area of the device substrate 102 and allows impingement cooling not to be limited to a specific location of the device substrate 102, thereby enhancing the device substrate's ability to dissipate heat from its surfaces 104-1 and 104-2 with or without impingement cooling by a jet of coolant. More details on the predetermined pattern and surface profile of the device substrate are discussed below with reference to FIG. 3.

The device substrate 102 is configured to spread (and dissipate) heat across its body and surfaces, e.g., the first surface 104-1 and the second surface 104-2. In some embodiments, the device substrate 102 is configured to uniformly spread (and dissipate) heat across its body and/or surfaces. Alternatively, in some embodiments, the device substrate 102 is configured to spread the heat more efficiently on one or more portions (e.g., a portion coupled to the electronic component 106). In some embodiments, the device substrate 102 includes a single crystal diamond configured to spread and dissipate heat. Alternatively, in some embodiments, the device substrate 102 includes a polycrystalline diamond substrate configured to spread and dissipate heat. In some embodiments, the device substrate 102 has a thermal expansion coefficient no greater than (i.e., equal to or less than) $1 \times 10^{-6}$ m/(m·° C.). In some embodiments, the thermal expansion coefficient of the device substrate 102 is a linear thermal expansion coefficient that varies linearly with a temperature.

The electronic component 106 is thermally coupled to the device substrate 102. The electronic component 106 can be coupled on the first surface 104-1 or the second surface 104-2 of the device substrate 102. In some embodiments, the electronic component 106 is an integral part of the device substrate 102. Alternatively, in some embodiments, the electronic component 106 is mounted on the device substrate 102 in a hybrid manner. The electronic component 106 is configured to be smaller than the device substrate 102 and/or the cooling substrate 108. A smaller size of the electronic component 106 allows for a greater relative variance in size with respect to the device substrate 102, and this relative variance in size is optionally caused by a mismatch of thermal expansion between the electronic component 106 and device substrate 102. In an example, the electronic component 106 is less than one tenth the size of the device substrate 102, and a device substrate 102 having a surface area of 10×6 mm$^2$ is thermally coupled to an electronic component 106 having a surface area less than 1×6 mm$^2$.

During its normal operation, the electronic component 106 generates heat that may increase an operating temperature of the electronic component 106 locally. The heat generated by the electronic component can also be distributed to the entire semiconductor system 100 to increase a temperature of the semiconductor system 100. In some embodiments, the electronic component 106 (e.g., a RF component) is configured to operate with a high power (e.g., >10 Watts) and/or at a high speed (e.g., >1 GHz), which causes the electronic component 106 to excessive heat that needs to be dissipated via the semiconductor system 100. Specifically, the heat generated by the electronic component 106 is partially dissipated to air from an open surface of the electronic component 106, and partially absorbed by the device substrate 102 that is thermally coupled to the electronic component 106. As its operating temperature increases, the electronic component 106 expands according to its thermal expansion coefficient (e.g., in a range of 3-4×10$^{-6}$ m/(m·° C.)).

In some embodiments, the electronic component 106 is a semiconductor die or a semiconductor device package. In some embodiments, the electronic component 106 has a substrate made of silicon carbide. In some embodiments, the electronic component 106 is configured to operate in an RF range (e.g., 20 kHz to around 300 GHz). In some embodiments, the electronic component 106 is configured to operate in a plurality of RF bandwidths in an RF range (e.g., RF bandwidths in 20 kHz to around 300 GHz). Alternatively, in some embodiments, the electronic component 106 is configured to operate in a radio frequency range between 100 MHz to 500 MHz.

The electronic component 106 is configured to be cooled down by the device substrate 102. In some embodiments, the electronic component 106 includes a predetermined pattern (i.e., surface profile) configured to increase a surface area of the electronic component 106. The predetermined pattern of the electronic component 106 is optionally identical to or distinct from the predetermined pattern of the device substrate 102. The predetermined pattern of the electronic component 106 includes one or more heat transfer structures (e.g., fins, pins, depressions, channels, and ridges). Optionally, these heat transfer structures have identical or different sizes (e.g., cross sectional areas and heights). Optionally, these heat transfer structures have identical or different geometric shapes. Optionally, the heat transfer structures are arranged in a symmetric or asymmetric manner in the predetermined pattern of the electronic component 106. As such, the predetermined pattern of the electronic component 106 increases a surface area of the electronic component 106, thereby helping dissipation of the heat generated by the electronic component 106.

The cooling substrate 108 is coupled to the device substrate 102. The cooling substrate 108 includes a third surface 110-1, and a fourth surface 110-2 opposite the third surface 110-1. In some embodiments, the third surface 110-1 faces (or is adjacent to) the second surface 104-2 of the device substrate 102. A cavity 116 is formed between the third surface 110-1 and the second surface 104-2. In some embodiments, the third surface 110-1 and the fourth surface 110-2 have the same length and/or surface area as the first surface 104-1 and the second surface 104-2 of the device substrate 102 (e.g., a surface area of approximately 10×6 mm$^2$).

In some embodiments, the cooling substrate 108 is coupled to the device substrate 102 via the one or more spacers 118. The one or more spacers 118 are configured to separate the second surface 104-2 of the device substrate 102 and the third surface 110-1 of the cooling substrate 108 and define a height of the cavity 116 formed between the surfaces 104-2 and 110-1. The one or more spacers 118 have a predetermined length (represented by "L_s" in FIG. 1), e.g., between 100 um and 3 mm. In some embodiments, the one or more spacers 118 are integral parts of the cooling substrate 108. Conversely, in some embodiments, the one or more spacers 118 are standalone components coupled between the cooling substrate 108 and the device substrate 102. The cooling substrate 108 is configured to be easy to machine and couple into the semiconductor system 1000.

In some embodiments, the cooling substrate 108 is made of one or more of glass, a nickel-cobalt ferrous alloy, a 36% nickel steel alloy (e.g., Invar), and Molybdenum. An example of the nickel-cobalt ferrous alloy is a Kovar metal alloy that is approximately made of 29% nickel, 17% cobalt and the balance iron. Alternatively or additionally, in some embodiments, the cooling substrate 108 is a metallic material having a thermal expansion coefficient in a range including a predefined thermal expansion coefficient. In some embodiments, the range is 1×10$^{-6}$ m/(m·° C.) to 8×10$^{-6}$ m/(m·° C.), and the thermal expansion coefficient of the metallic material is in the range. In some embodiments, the range is 1×10$^{-6}$ m/(m·° C.) to 7×10$^{-6}$ m/(m·° C.), and the thermal expansion coefficient of the metallic material is in the range. In some embodiments, the range is 1×10$^{-6}$ m/(m·° C.) to 3×10$^{-6}$ m/(m·° C.), and the thermal expansion coefficient of the metallic material is in the range. In some embodiments, the predefined thermal expansion coefficient is 1×10$^{-6}$ m/(m·° C.). In some embodiments, at least a portion of the device substrate 102 and the cooling substrate 108 have similar coefficients of thermal expansion, i.e., a mismatch of the thermal expansion coefficients of the portion of the device substrate 102 and cooling substrate 102 is less than a threshold mismatch (e.g., 0.5%, 1%). In some embodiments, the threshold mismatch is based on a thermal cycle and the size of the interface (e.g., contact surface) between components.

The range of 1×10$^{-6}$ m/(m·° C.) to 8×10$^{-6}$ m/(m ° C.) allows for the cooling substrate 108 to be implemented in a wide variety of systems at an affordable price. In particular, this range allows for the cooling substrate 108 to be implemented in high precision systems that have strict design constraints as well as more tolerant systems that allow for greater variances. Further, this range allows for a material to be selected based on its ease of use (e.g., Invar is harder to work with than Molybdenum). Additionally or alternatively, the range of 1×10$^{-6}$ m/(m·° C.) to 8×10$^{-6}$ m/(m·° C.) allows for a thermal expansion coefficient for the cooling substrate 108 to be selected based on its operational use (e.g., high or low temperature systems, constant temperature systems, variable temperature systems, etc.).

The cooling substrate 108 includes the plurality of vias 112 between the third surface 110-1 and the fourth surface 110-2. The plurality of vias 112 have a predetermined size. In some embodiments, the predetermined size of the plurality of vias 112 is a diameter of between 50 to 200 micrometers inclusive. This diameter range allows for coolant to efficiently enter and exit the cooling substrate 108 while also providing efficient heat transfer. In particular, as discussed below, in some implementations, the efficiency of the heat transfer between the device substrate 102 and the coolant is based, in part on the shape and/or size of the plurality of vias 112. In some embodiments, each via of the plurality of vias 112 has the same predetermined size. Alternatively, in some embodiments, at least one via of the plurality of vias 112 has a predetermined size that is distinct from other vias of the plurality of vias 112. When impingement cooling is applied to dissipate heat of the device substrate 102, coolant (e.g., air, water, etc.) flows through the plurality of vias 112 and enter the cavity 116 between the cooling substrate 108 and the device substrate 102.

In some embodiments, the plurality of vias 112 are coupled to the one or more nozzles 114 (also referred to as a plurality of nozzle structures). The one or more nozzles 114 are configured to force or push in the coolant through the plurality of vias 112. In some embodiments, the cooling substrate 108 and the one or more nozzles 114 have thermal expansion coefficients similar to one another, i.e., a difference of the thermal expansion coefficients of the cooling substrate 108 and nozzles 114 is less than a threshold mismatch (e.g., 1%). By these means, the cooling substrate 108 and the one or more nozzles 114 can expand proportionally or in a controlled manner, without compromising a corresponding impingement cooling process. In some embodiments, the one or more nozzles 114 are optional as the plurality of vias 112 operate as a nozzle.

The cavity 116 is defined by at least the device substrate 102 and the cooling substrate 108. The distance between the second surface 104-2 of the device substrate 102 and the third surface 110-1 of the cooling substrate 108 defines the height of the cavity 116. In some embodiments, the distance between the second surface 104-2 of the device substrate 102 and the third surface 110-1 of the cooling substrate 108 is equal to the predetermined length of the one or more spacers 118. In an example, the distance between the second surface 104-2 and the third surface 110-1 is between 100 micrometers (μm) to 3 mm, so is the height of the cavity 116. In another example, the cavity 116 separates the second surface 104-2 of the device substrate 102 and the third surface 110-1 of the cooling substrate 108 by at least 100 μm. This separation distance between the second surface 104-2 and the third surface 110-1 allows for coolant to efficiently and substantially impinge on the second surface 104 and thus provide efficient heat transfer. In particular, as discussed below, in some implementations, the efficiency of the heat transfer between the device substrate 102 and the coolant is based, in part, distance (e.g., separation distance) to diameter (predetermined size of the plurality of vias 112) ratio. In some embodiments, a ratio with a separation distance of 100 μm to vias with a diameter between 50 to 200 micrometers has been found to provide efficient heat transfer while allowing the device substrate 102 and the cooling substrate 108 to remain thermally coupled.

In some embodiments, the cavity 116 is fully sealed except the plurality of vias 112, thereby allowing coolant to flow through the plurality of vias 112 of the cooling substrate 108 (e.g., to enter at the fourth surface 110-2 and exit at the third surface 110-1 of the cooling substrate 108, and vice versa). Stated another way, the vias 112 allow the coolant to flow between the third and fourth surfaces, and the coolant is configured to enter and exit the cavity via the plurality of vias. In some embodiments, the coolant is one of: air, water, refrigerants, or other fluids and/or gasses. The coolant flowing through the plurality of vias 112 of the cooling substrate 108 impinges on the second surface 104-2 of the device substrate 102. After the coolant impinges upon the device substrate 102, the coolant absorbs and carries away part of the heat that has been dissipated from the electronic component 106 to the device substrate 102, thereby providing an efficient heat dissipation path to the electronic component 106 from a rear surface of the electronic component 106.

Specifically, the device substrate 102 receives heat generated by the electronic component 106 from the rear surface of the electronic component 106. For example, the first surface 104-1 of the device substrate 102 receives heat generated by the electronic component 106's operation. The device substrate 102 spreads the received heat across a body, the first surface 104-1 and the second surface 104-2. The device substrate 102 dissipates the heat received from the electronic component 106 to the coolant that is injected into the cavity 116 through the plurality of vias 112 (and/or one or more nozzles 114). By these means, the device substrate 102 cools the electronic component 106 through heat transfer with the coolant injected into the cavity 116.

In some embodiments, an efficiency of the heat transfer between the device substrate 102 and the coolant is based, in part, on sizes and shapes of the vias 112, sizes and shapes of the one or more nozzles 114, a distance to diameter ratio, an impingement angle, Reynolds number, the number of vias 112, the number of nozzles 114, separations among the vias 112, separations among the nozzles 114, a coolant flow rate, a type of coolant, a coolant temperature, and/or other factors known in the art. The distance to diameter ratio refers to a ratio between the height of the cavity 116 (e.g., L_s) and a predetermined diameter of the plurality of vias 112.

Figure 2:
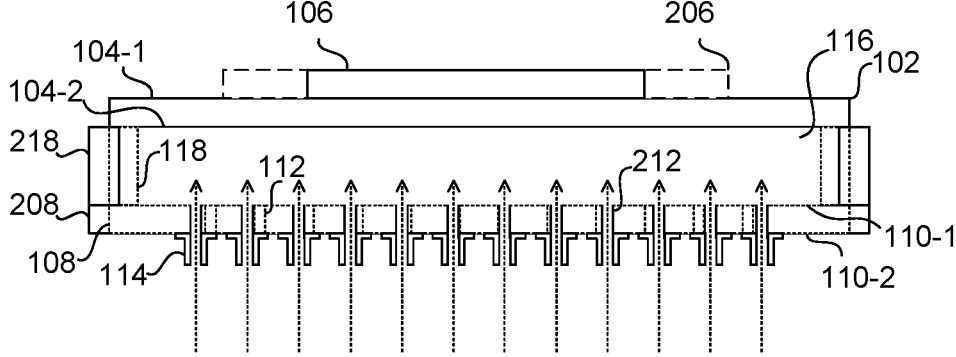
FIG. 2 is a cross sectional view of a semiconductor system in a thermally expanded state, in accordance with some embodiments.

FIG. 2 is a cross sectional view of a semiconductor system 200 in a thermally expanded state, in accordance with some embodiments. The semiconductor system 200 is an instance of the semiconductor system 100 of FIG. 1 when the semiconductor system 100 experiences temperature changes (e.g., heating or cooling). The semiconductor system 200 includes one or more of: a device substrate 102, an electronic component 106, a cooling substrate 108, a plurality of vias 112, one or more nozzles 114, a cavity 116, and one or more spacers 118.

One or more components of the semiconductor system 200 expand with an increase in temperature. For example, heat generated by the electronic component 106 may cause the increase in temperature in the semiconductor system 200. In some situations, heat is introduced into the semiconductor system 200 by environmental conditions (e.g., ambient air, gases, friction, etc.) and/or one or more components external to the semiconductor system 200 (e.g., other electrical components, engines, etc.). Conversely, the one or more components of semiconductor system 200 contracts with a drop in temperature. Heat is dissipated by a surrounding airflow, impingement cooling (generated by the device substrate 102 and cooling substrate 108 working in conjunction), environmental conditions, and/or one or more components external to the semiconductor system 200 (e.g., fans). In some embodiments, thermal expansion or contraction is approximated by a linear thermal expansion equation as follows:

$$\Delta L = (\alpha_L)^*(\Delta T)$$

where $\Delta L$ is a change of length, $\alpha_L$ is a linear thermal expansion coefficient, and $\Delta T$ is a change in temperature (e.g., the increase or drop in temperature).

In some embodiments, the device substrate 102 has a thermal expansion coefficient that is less than a predefined threshold expansion coefficient, i.e., $1 \times 10^{-6}$ m/(m·° C.), and has a relatively low propensity to change in size when exposed to temperature changes. As described above with reference to FIG. 1, the device substrate 102 is configured to spread heat across its body and surfaces (i.e., the first surface 104-1 and the second surface 104-2). In some embodiments, the device substrate 102 uniformly spreads heat across its body and surfaces. Alternatively, in some embodiments, the device substrate 102 has improved heat transfer on one or more regions of its surfaces using a predetermined pattern or surface profile. This allows the device substrate 102 to dissipate heat generated by the electronic component 106 efficiently, particularly when the predefined pattern is applied jointly with impingement cooling.

In some embodiments, the electronic component 106 is mounted on the device substrate 102 in a hybrid manner. The electronic component 106 has a first thermal expansion coefficient, and the device substrate 102 has a second thermal expansion coefficient. Further, in some embodiments, a mismatch of the second thermal expansion coefficient of the electronic component and the first thermal expansion coefficient of the device substrate 102 is less than a threshold mismatch (e.g., within ±5%). Alternatively, in some embodiments, a size of the electronic component 106 is much smaller than a size of the device substrate 102, e.g., less than one tenth of the size of the device substrate 102. When exposed to a temperature variation that is within a temperature tolerance, the electronic component 106 can be secured on the device substrate 102 without being detached, regardless of whether the mismatch of the first and second thermal expansion coefficients exceeds the threshold mismatch.

In some embodiments, the spacers 118 are distinct from the device substrate 102 and the cooling substrate 108. The spacers 118 have a third thermal expansion coefficient, and the cooling substrate 108 has a fourth thermal expansion coefficient. A mismatch of the second thermal expansion coefficient of the device substrate 102 and the third thermal expansion coefficient of the spacers 118 is less than a respective threshold mismatch (e.g., within ±5%). Similarly, a mismatch of the third thermal expansion coefficient of the spacers 118 and the fourth thermal expansion coefficient of the cooling substrate 108 is less than a respective threshold mismatch (e.g., within ±5%). Alternatively and additionally, in some embodiments, the spacers 118 are integrated in the cooling substrate 108. A mismatch of the second thermal expansion coefficient of the device substrate 102 and the fourth thermal expansion coefficient of the cooling substrate 108 is less than a respective threshold mismatch (e.g., within ±5%). It is noted that different threshold mismatches in the semiconductor system 200 are optionally identical to or distinct from each other.

In the illustrative example shown in semiconductor system 200, the device substrate 102 maintains substantially similar dimensions to the device substrate 102 shown in semiconductor system 100 (e.g., showing a +/−1% increase to no increase) when exposed to high temperatures (e.g., relative to baseline conditions, such as ambient temperature). For example, the first surface 104-1 and the second surface 104-2 of the device substrate 102 maintain substantially similar surface lengths as those shown in the semiconductor system 100 (e.g., approximately 10×6 mm² with a +/−1% increase or no increase) when the device substrate 102 is exposed to high temperatures. High temperatures, for purposes of this disclosure, means temperatures 5° C. above baseline conditions. As further shown in semiconductor system 200, in some embodiments, the device substrate 102 (including the first surface 104-1 and the second surface 104-2) expands disproportionately relative to the electronic component 106, the cooling substrate 108, and/or other components when exposed to high temperatures. More specifically, the device substrate 102 does not expand or slightly expands in relation to the electronic component 106, the cooling substrate 108, and/or other components when exposed to high temperatures. The disproportionate expansion of the device substrate 102 is due to its thermal expansion coefficient (e.g., $1 \times 10{-6}$ m/(m·° C.)).

Additionally, in some embodiments, the device substrate 102 (including the first surface 104-1 and the second surface 104-2) contracts (or returns to an unaltered size) when exposed to low temperatures (e.g., relative to baseline conditions, such as ambient temperature) and/or when heat is removed from the device substrate 102. Low temperatures, for purposes of this disclosure, means temperatures 5° C. below baseline conditions. In some embodiments, impingement cooling received by the device substrate 102 counteracts high temperatures that the device substrate 102 experiences (e.g., due to heat transfer from the electronic component 106). For example, in some embodiments, the electronic component 106 generates heat through operation that is transferred to the device substrate 102 and causes the device substrate 102 to expand a first length. Simultaneously, or near simultaneously, the device substrate 102 is impingement cooled by the cooling substrate 108 such that the device substrate 102 contracts the first length (i.e., effectively leaving the size of the device substrate 102 unchanged). In another example, in some embodiments, the electronic component 106 generates heat through operation that causes the device substrate to expand the first length while the impingement cooling causes the device substrate 102 to contract a second length (less than the first length). In this example, the device substrate 102 is exposed to high temperatures, which cause the device substrate 102 to expand; however, the change in size of the device substrate 102 would be minimized (e.g., less than a 1% increase in size) due to the impingement cooling. In another example, in some embodiments, the electronic component 106 generates heat through operation that causes the device substrate to expand the first length while the impingement cooling causes the device substrate 102 to return to its unaltered size. In other words, the device substrate 102 is exposed to low temperatures (relative to the baseline conditions) or has returned to baseline conditions, which results in no change in size. Although the above examples describe providing impingement cooling on the device substrate 102 to minimize or counteract thermal expansion due to heat, it should be noted that the device substrate 102 would experience minimal to no thermal expansion without cooling due to its low thermal expansion coefficient.

The above examples are non-exhaustive and provided for illustrative purposes. In some embodiments, the overall temperature change of a respective component of the semiconductor system 100 (e.g., the device substrate 102) is used to determine the change in the component's size. In other words, the change in size in not determined by subtracting the thermal contraction from the thermal expansion, but by using the overall change in temperature with the linear thermal expansion equation and/or other similar equations.

Thermally expanded electronic component 206 is an instance of the electronic component 106 when exposed to high temperatures (relative to baseline conditions, such as ambient temperature) and/or operating at high temperatures. The electronic component 106 is configured to expand based, in part, on its own generated heat (through operation) and/or other sources of heat as described above. In some embodiments, the electronic component 106 has a higher propensity to change in size than the device substrate 102 when exposed to temperature changes due to its a higher thermal expansion coefficient (e.g., approximately equal to $3\times10^{-6}$ m/(m·° C.) to $4\times10^{-6}$ m/(m·° C.)). Thus, in some embodiments, the device substrate 102 is selected to substantially match the thermal expansion coefficient of the device substrate 102 with that of the electronic component 106 included in the semiconductor system.

As shown in semiconductor system 200, in some embodiments, the thermally expanded electronic component 206, when exposed to high temperatures and/or operating at high temperatures, expands across a surface of the device substrate 102 (e.g., the first surface 104-1 or the second surface 104-2, whichever surface of the device substrate 102 the electronic component 106 is thermally coupled to). The smaller size of the electronic component 106 (in relation to the device substrate 102) allows the electronic component 106 to change in size while remaining coupled to a surface of the device substrate 102. In some embodiments, the change in size of the thermally expanded electronic component 206 is substantial (e.g., at least two times greater than electronic component 106). In some embodiments, the smaller size of the electronic component 106 allows for greater variances in size changes (e.g., increases of at least two times its initial size) while remaining coupled to the device substrate 102. For example, in some embodiments, when the electronic component 106 is not generating heat (or generating minimal heat) through operation, or when the semiconductor system 100 is not exposed to high temperatures, the electronic component 106 is approximately one tenth the size of the device substrate 102. When the electronic component 106 generates heat through operation and/or when the semiconductor system 100 is exposed to high temperatures, the size of the electronic component 106 expands to be greater than one tenth the size of the device substrate 102 (while remaining thermally coupled the device substrate 102 (as shown in semiconductor system 200)).

In some embodiments, the electronic component 106 contracts (or returns to an unaltered size) when exposed to low temperatures (e.g., relative to baseline conditions, such as ambient temperature) and/or when heat is removed from the electronic component 106. As described above, the electronic component 106 and the device substrate 102 are thermally coupled, which allows the device substrate 102 to transfer heat from the electronic component 106. The removed heat from the electronic component 106 minimizes or reduces the total thermal expansion of the electronic component 106. As an example, in some embodiments, the electronic component 106 generates heat through operation that causes the it to expand a first length. Simultaneously, or near simultaneously, the device substrate 102 (which is impingement cooled by the cooling substrate 108) transfers heat from the electronic component 106 via their thermal coupling. The removed heat from the electronic component 106 reduces its overall temperature change and, as such, reduces its overall change in size due to thermal expansion. Similar to the process described above with respect to the device substrate 102, the overall temperature change of the electronic component 106 is used to determine its change in size (e.g., using the linear thermal expansion equation and/or other similar equations). In contrast to the device substrate 102, the electronic component 106 is configured to expand substantially when exposed to high temperatures. In particular, the electronic component 106 has a thermal expansion coefficient 3 to 4 times greater than the device substrate 102, which gives it a greater propensity to increase its size when heated. The heat removed by the device substrate 102 helps reduce the expansion by decreasing the overall temperature change while allowing for better performance gains (e.g., operating at higher speeds and/or operating at higher power).

Thermally expanded cooling substrate 208 is an instance of the cooling substrate 108 when exposed to high temperatures (e.g., relative to baseline conditions). The cooling substrate 108 is configured to expand based, in part, on heat generated by one or more components of the semiconductor system 200 (e.g., operation of electronic component 106), and/or heat introduced into the semiconductor system 200 by environmental conditions and/or one or more components external to the semiconductor system 200. In some embodiments, the cooling substrate 108 experiences less temperature increases due to its relative distance from the electronic component 106 and/or the separation provided by the cavity 116. In some embodiments, the cooling substrate 108 has a thermal expansion coefficient $1\times10^{-6}$ m/(m·° C.) to $8\times10^{-6}$ m/(m·° C.). As such, in some embodiments, the cooling substrate 108 can have either a low (e.g., similar to the device substrate 102) or high (relative to the electronic component 106) propensity to change in size. In some embodiments, the cooling substrate 108 has a thermal expansion coefficient as close to $1\times10^{-6}$ m/(m·° C.) as possible. Additional information on the thermal expansion coefficient of the cooling substrate 108 is provided above in FIG. 1.

As shown in semiconductor system 200, in some embodiments, the thermally expanded cooling substrate 208, when exposed to higher temperatures, expands while remaining coupled to the device substrate 102 (e.g., the first surface 104-1 or the second surface 104-2, whichever surface of the device substrate 102 the cooling substrate 108 is coupled to). For example, in some embodiments, when the cooling substrate 108 is not exposed to high temperatures, the cooling substrate 108 is approximately the same size as the device substrate 102 (e.g., $10\times6$ mm$^2$), and when the cooling substrate 108 is exposed to high temperatures, the size of the cooling substrate 108 expands but remains coupled with the device substrate 102 (i.e., not expanding substantially more than $10\times6$ mm$^2$ (e.g., expanding less than 1%)). In some embodiments, the cooling substrate 108 has minimal change in size (relative to the electronic component 106) because it is further from the electronic component 106 than the device substrate 102. In other words, the cooling substrate 108 does not directly receive heat generated by operation of the electronic component 106 and, as such, does not substantially thermally expand. Additionally or alternatively, in some embodiments, the cooling substrate 108 changes less in size (relative to the electronic component 106) because it is the direct source of cooling (e.g., enabling coolant to enter the plurality of vias 112 and the cavity 116 before exiting; FIG. 1). In some embodiments, the cooling substrate 108 experiences lower increases in temperature and, as such, does not experience as much thermal expansion as the electronic component 106. Because the cooling substrate 108 experiences lower increases in temperature, the selected thermal expansion coefficient for the cooling substrate 108 can have greater variances (e.g., from $1 \times 10^{-6}$ m/(m·° C.) to $8 \times 10^{-6}$ m/(m·° C.)).

In some embodiments, the third surface 110-1, the fourth surface 110-2 (opposite the third surface 110-1), the one or more spacers 118, the plurality of vias 112, and/or the one or more nozzles 114 expand proportionate to the cooling substrate 108. In particular, in some embodiments, the one or more components of the cooling substrate 108 have the same thermal expansion coefficient as the cooling substrate 108 such that their proportions remain the same when exposed to high or low temperatures (e.g., relative to baseline conditions). For example, in some embodiments, a plurality of thermally expanded vias 212, one or more thermally expanded spacers 218, and/or one or more thermally expanded nozzles (not shown) have the same change in size as the thermally expanded cooling substrate 208 (the third surface 110-1 and the fourth surface 110-2).

In some embodiments, the cooling substrate 108 contracts (or returns to an unaltered size) when exposed to low temperatures (e.g., relative to baseline conditions) or when heat is removed from the cooling substrate 108. The cooling substrate 108 is exposed to low temperatures and/or experiences heat transfer (e.g. removal of heat) via the coolant surrounding the cooling substrate 108 (e.g., air), coolant entering and exiting the plurality of vias 112, coolant within the cavity 116, and/or other environmental conditions. The low temperatures and/or heat transfer experienced by the cooling substrate 108 minimizes or reduces the total thermal expansion of the cooling substrate 108. More specifically, the cooling substrate 108 direct exposure to the coolant reduces the overall temperature increase of the cooling substrate 108 and, as such, reduces its overall change in size due to thermal expansion. Similar to the processes described above with respect to the device substrate 102 and the electronic component 106, the overall temperature change of the cooling substrate 108 is used to determine its change in size (e.g., using the linear thermal expansion equation and/or similar equations). As indicate above, the cooling substrate 108 has greater variances in thermal expansion coefficient; however, because the cooling substrate 108 does not experience high temperature increases (in relation to the device substrate 102 and the electronic component 106) its thermal expansion (i.e., change in size) is not as large as the electronic component 106. This smaller thermal expansion allows the cooling substrate 108 to remain coupled to the device substrate 102. Alternatively, in some embodiments, in order to reduce the thermal expansion of the cooling substrate 108, the thermal expansion coefficient of the cooling substrate is selected as close to $1 \times 10^{-6}$ m/(m·° C.) as possible to lower its propensity to change in size.

The cavity 116 is defined by the device substrate 102 and the cooling substrate 108 as described above in semiconductor system 100. In some embodiments, the size of the cavity 116 increases based on the thermal expansion of the device substrate 102 and the cooling substrate 108. For example, as shown in semiconductor system 200, in some embodiments, the relative sizes of the device substrate 102 and/or the cooling substrate 108 change (e.g., increase when exposed to higher temperatures) and, as such, increase the overall size of the cavity 116. As further shown in semiconductor system 200, the cavity 116 is configured to remain fully sealed (with the exception of the plurality of vias 112) while the one or more components of the semiconductor system 200 are allowed expanded (e.g., the thermally expanded cooling substrate 208). In some embodiments, the increased cavity 116 size improves impingement cooling by increasing the surface of the device substrate 102 (i.e., the surface area of the device substrate 102 is increased allowing for improved heat transfer). As described above in semiconductor system 100, the cavity 116 is configured such that coolant flows through the plurality of vias 112 of the cooling substrate 108 (e.g., enter at the fourth surface 110-2 and exit at the third surface 110-1 of the cooling substrate 108). The coolant flowing through the plurality of vias 112 of the cooling substrate 108 impinge on the second surface 104-2 of the device substrate 102 cooling the device substrate 102.

As further described above in semiconductor system 100, the heat transfer (e.g., impingement cooling efficiency) of the device substrate 102 can be based on one or more factors (e.g., the size and/or shape of the openings of the plurality of vias 112 and/or the one or more nozzles 114, a distance to diameter ratio, Reynolds number, etc.). In some embodiments, thermal expansion effects the overall efficiency of the heat transfer. For example, in some embodiments, the thermally expanded cooling substrate 208 has a plurality of vias 112 with increased diameters that can increase the amount of coolant that enters the cavity 116. A number of different factors, alone or in combination, can affect the overall heat transfer of the device substrate 102. The one or more factors are described above in reference to FIG. 1.

Figure 3:
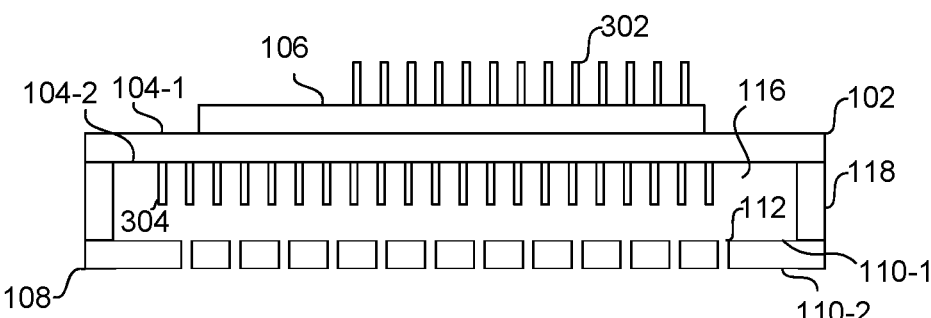
FIG. 3 is a cross sectional view of a semiconductor system having an increased surface area, in accordance with some embodiments.

FIG. 3 is a cross sectional view of a semiconductor system 300 having an increased surface area, in accordance with some embodiments. The semiconductor system 300 is an instance of the semiconductor system 100 of FIG. 1, including one or more components, such as a device substrate 102, an electronic component 106, a cooling substrate 108, a plurality of vias 112, one or more nozzles 114, a cavity 116, and one or more spacers 118. In the semiconductor system 300, at least one surface of the electronic component 106 and device substrate 102 has a predetermined pattern (i.e., surface profile) to improve a heat transfer efficiency. In some embodiments, the predetermined patterns are included on other components of the semiconductor system 300. For example, in some embodiments, the predetermined patterns are included on the cooling substrate 108 and/or the one or more spacers 118 to improve heat transfer of the semiconductor system 300.

In some embodiments, the device substrate 102 includes predetermined patterns on its first surface 104-1 and/or its second surface 104-2, which is opposite to the first surface 104-1. In some embodiments, the predetermined patterns are configured to increase the surface area of the device substrate 102 such that heat transfer from the device substrate 102 is improved. For example, as shown in the semiconductor system 300, one or more fins 304 are coupled to the second surface 104-2 of the device substrate 102. In some embodiments, the fins 304 are exposed to a jet of coolant applied for impingement cooling. In some embodiments, the increased surface area created by the predetermined patterns of the device substrate 102 allows the device substrate 102 to be cooled even when impingement cooling is not focused at a particular portion of the device substrate 102. Further, in some embodiments, the predetermined patterns of the device substrate 102 allow the device substrate 102 to be cooled agnostic to the direction of the impingement cooling, independently of an impingement angle of the coolant.

In some embodiments, the predetermined pattern is on the first surface 104-1 of the device substrate 102. In some embodiments, the predetermined pattern is adjacent to the electronic component 106. Conversely, in some embodiments, the predetermined pattern is on the second surface 104-2 of the device substrate 102, and includes a plurality of fins 304. The fins 304 are configured to transfer the heat from a first end coupled to the second surface 104-2 to a second end opposite the first end (e.g., a free end). In this way, heat is transferred by the fins from the device substrate 102 to a predetermined distance in space. In some embodiments, the predetermined distance is equal to the length of the fins 304 (i.e., a predetermined pattern length). The predetermined pattern length is less than a height of the cavity 116 (e.g., 100 μm to 3 mm). The fins 304 are configured to be cooled by both ambient coolant (e.g., air) and/or forced coolant flowing through the fins 304.

In some embodiments, the electronic component 106 includes a predetermined pattern (i.e., a surface profile) on its open surface, i.e., a surface opposite another surface that is thermally coupled to the first surface 104-1 of the device substrate 102. For example, the electronic components 106 includes one or more fins 302 on the open surface of the electronic component 106. In some embodiments, the fins 302 are configured to be cooled by ambient coolant (e.g., air) and/or forced coolant flowing around or over the open surface of the electronic component 106. As such, the predetermined pattern of the electronic component 106 is configured to increase the surface area of the electronic component 106, such that heat transfer from the electronic component 106 is improved.

Figure 4A:
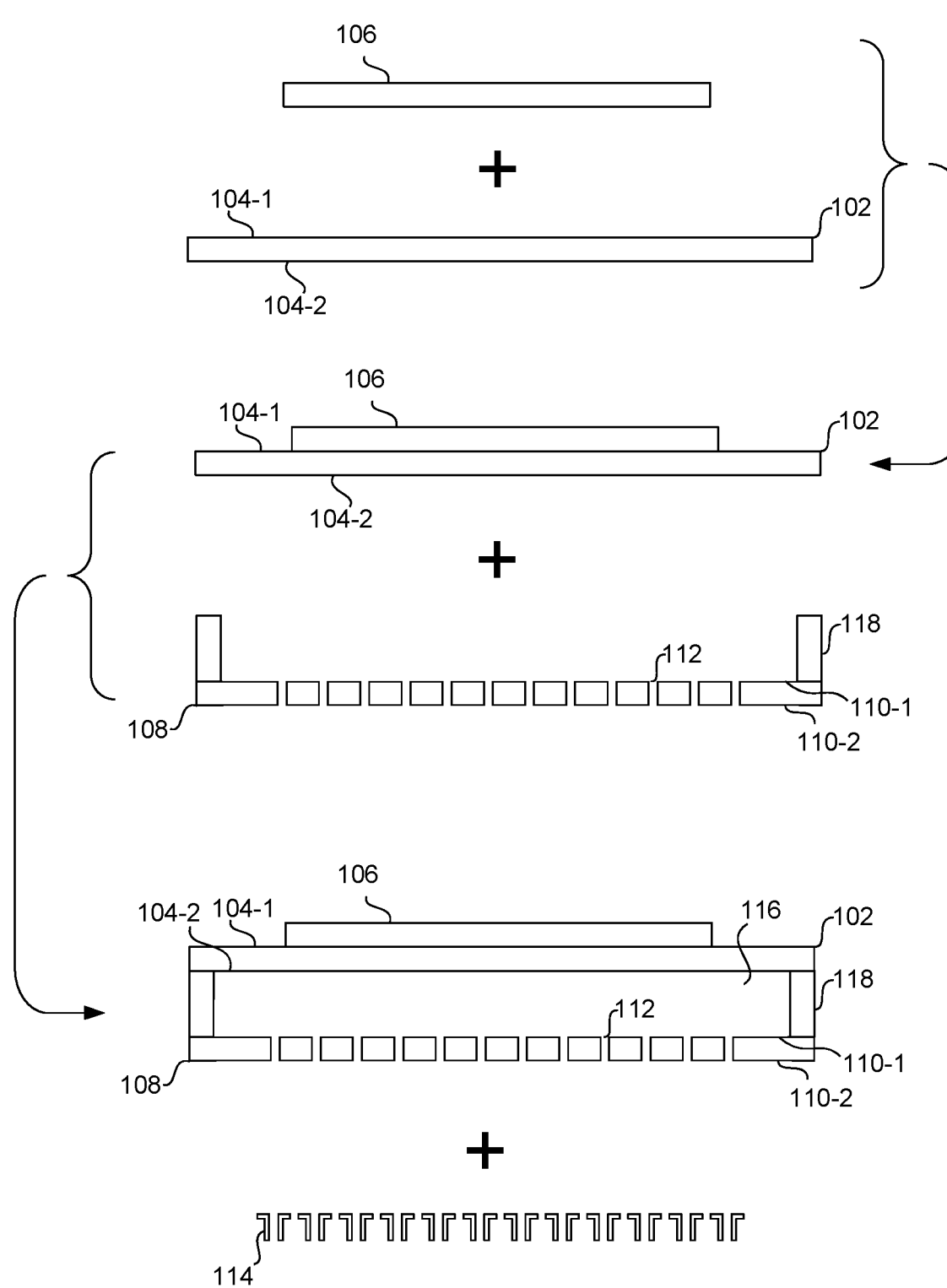

FIGS. 4A and 4B are cross sectional views and a flow chart of a process 400 of fabricating a semiconductor system, in accordance with some embodiments, respectively. Referring to FIG. 4A, the process 400 involves one or more of a device substrate 102, an electronic component 106, a cooling substrate 108 having a plurality of vias 112, and one or more spacers 118. The one or more spacers 118 are optionally standalone components or integrated in the cooling substrate. The device substrate 102 and cooling substrate 108 are separately prepared, and assembled to each other to form the cavity 116. One or more nozzles 114 are coupled to the vias 112 on the cooling substrate 108 to inject a coolant into the cavity 116 for the purposes of dissipating heat from the device substrate 102.

Referring to FIG. 4B, the process 400 of fabricating the semiconductor system includes providing (452) a device substrate 102. The device substrate 102 includes a first surface 104-1 and a second surface 104-2 opposite the first surface 104-1. The process 400 further includes forming (454) an electronic component 106 on the first surface 104-1 of the device substrate 102 and providing (456) a cooling substrate 108 having a third surface 110-1, a fourth surface 110-2 opposite the third surface 110-1, and a plurality of vias 112 between the third surface 110-1 and fourth surface 110-2 surface. The cooling substrate 108 is coupled (458) to the device substrate 102. The third surface 110-1 faces (460) the second surface 104-2 of the device substrate 102. The second surface 104-2 and the third surface 110-1 define (462) a cavity 116 therebetween. In use, coolant flows from the fourth surface 110-2 through the plurality of vias 112 exit at the third surface 110-1, enters the cavity 116 between the second surface 104-2 and third surface 110-1, and impinges on the second surface 104-2 of the device substrate 102. In some embodiments, the process 400 includes coupling (464) a plurality of nozzle structures to a plurality of vias 112. One or more variations of the fabricated semiconductor systems are provided above in FIGS. 1-3.

In some embodiments, the process 400 further includes forming (466) a predetermined pattern (e.g., surface profile) on the device substrate 102 and/or the electronic component 106. The predetermined pattern includes one or more fins, pins, depressions, channel, ridges, etc. The predetermined pattern can have different sizes and/or geometric shapes. More details on the predetermined pattern are discussed above with reference to FIGS. 1 and 3.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will also be understood that, although the terms "first," "second," etc. may be used herein to describe various elements, these elements should not be limited by these terms. These terms are only used to distinguish one element from another. For example, a first region could be termed a second region, and, similarly, a second region could be termed a first region, without changing the meaning of the description, so long as all occurrences of the "first region" are renamed consistently and all occurrences of the "second region" are renamed consistently. The first region and the second region are both regions, but they are not the same region.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A semiconductor system, comprising:
   a device substrate having a first surface and a second surface opposite the first surface;
   an electronic component including a semiconductor device package thermally coupled to the first surface of the device substrate;
   a cooling substrate coupled to the device substrate, the cooling substrate further comprising a third surface facing the second surface, a fourth surface opposite the third surface, and a plurality of vias between the third and fourth surfaces; and
   a plurality of cavity fin structures coupled directly to the second surface of the device substrate, wherein the plurality of cavity fin structures is configured to direct, and dissipate, heat generated by the electronic component;
   wherein the second surface and the third surface define a cavity therebetween, such that in use coolant flows from the fourth surface through the plurality of vias to exit at the third surface, enters the cavity between the second and third surfaces, and impinges on the plurality of cavity fin structures;
   wherein at least a portion of one or more of the device substrate and the cooling substrate have similar coefficients of thermal expansion;

wherein the electronic component includes a top surface, a rear surface opposite to the top surface, and one or more external fin structures coupled to the top surface and exposed to air;

wherein the electronic component is external to the cavity, and configured to dissipate the heat from: (i) the top surface via the one or more external fin structures and (ii) from the rear surface via the plurality of cavity fin structures; and wherein each of the first, second, third, and fourth surfaces has a respective surface area of approximately $10 \times 6$ mm$^2$.

2. The semiconductor system of claim 1, wherein the device substrate comprises a polycrystalline diamond substrate configured to spread and dissipate heat.

3. The semiconductor system of claim 1, wherein the device substrate is configured to spread heat uniformly across its first and second surfaces.

4. The semiconductor system of claim 1, wherein the plurality of vias is coupled to a plurality of nozzle structures, and the cooling substrate and the plurality of nozzle structures have thermal expansion coefficients similar to one another.

5. The semiconductor system of claim 1, wherein the cooling substrate is coupled to the device substrate via one or more spacers.

6. The semiconductor system of claim 5, wherein the one or more spacers are integral parts of the cooling substrate.

7. The semiconductor system of claim 1, wherein the cooling substrate is made of one of a glass, a nickel-cobalt ferrous alloy, a 36% nickel steel alloy, and Molybdenum.

8. The semiconductor system of claim 1, wherein the cooling substrate is made of one of a metallic material having a thermal expansion coefficient in a range that includes a predefined thermal expansion coefficient of $1 \times 10^{-6}$ m/(m·° C.).

9. The semiconductor system of claim 8, wherein the range is $0-8 \times 10^{-6}$ m/(m·° C.), and the thermal expansion coefficient of the metallic material is in the range.

10. The semiconductor system of claim 8, wherein the range is $1-7 \times 10^{-6}$ m/(m·° C.), and the thermal expansion coefficient of the metallic material is in the range.

11. The semiconductor system of claim 8, wherein the range is $1-3 \times 10^{-6}$ m/(m·° C.), and the thermal expansion coefficient of the metallic material is in the range.

12. The semiconductor system of claim 1, wherein the cavity is fully sealed except for the plurality of vias that allow the coolant to flow between the third and fourth surfaces.

13. The semiconductor system of claim 1, wherein the electronic component is configured to operate in a radio frequency range, and the device substrate is made of silicon carbide.

14. The semiconductor system of claim 1, wherein the plurality of vias have a diameter of between 50 to 200 micrometers inclusive, and the cavity separates the second surface and the third surface by at least 100 μm.

15. The semiconductor system of claim 1, wherein the second surface and the third surface have a separation distance, and the plurality of vias have a via diameter, and a ratio between the separation distance and the via diameter is less than 2.

16. The semiconductor system of claim 1, wherein the second surface and the third surface have a separation distance, and the plurality of vias have a via diameter, and a ratio between the separation distance and the via diameter is in a range of 0.5-2.

17. The semiconductor system of claim 1, wherein the device substrate is coupled to both the cooling substrate and the plurality of cavity fin structures via the second surface of the device substrate, forming the cavity coupled to the rear surface of the electronic component.

18. The semiconductor system of claim 1, wherein:

the electronic component is less than one tenth the size of the device substrate;

the first surface and the second surface are substantially planar and parallel to each other;

the plurality of cavity fin structures are distinct from, and coupled to, the device substrate; and the one or more external fin structures are distinct from, and coupled to, the electronic component.

19. A method, comprising:

providing a device substrate having a first surface and a second surface opposite the first surface;

forming an electronic component including a semiconductor device package on the first surface of the device substrate;

providing a cooling substrate having a third surface, a fourth surface opposite the third surface, and a plurality of vias between the third and fourth surfaces, wherein:

the cooling substrate is coupled to the device substrate, the third surface faces the second surface of the device substrate, and the second surface and the third surface define a cavity therebetween, such that in use coolant flows from the fourth surface through the plurality of vias to exit at the third surface, and enters the cavity between the second and third surfaces; and providing a plurality of cavity fin structures coupled directly to the second surface of the device substrate inside the cavity, wherein the plurality of cavity fin structures are configured to interact with the coolant that impinges on the plurality of cavity fin structures to direct, and dissipate, heat generated by the electronic component;

wherein the electronic component is coupled to the first surface of the device substrate of the cavity, and includes a top surface, a rear surface opposite to the top surface;

wherein one or more external fin structures are exposed to air and individually coupled to the top surface of the electronic component; and wherein the electronic component is external to the cavity, and configured to dissipate the heat from: (i) the top surface via the one or more external fin structures and (ii) from the rear surface via the plurality of cavity fin structures; and wherein each of the first, second, third, and fourth surfaces has a respective surface area of approximately $10 \times 6$ mm$^2$.

20. The method of claim 19, further comprising forming predetermined patterns on at least one of the device substrate and the electronic component.

* * * * *